(12) United States Patent
Kapps et al.

(10) Patent No.: US 6,969,941 B1
(45) Date of Patent: Nov. 29, 2005

(54) SENSORY FEEDBACK SYSTEM FOR ELECTROACTIVE POLYMER BASED TRANSDUCERS

(75) Inventors: Alex Kapps, Thornhill (CA); Landy Toth, Toronto (CA); Andrew A. Goldenberg, Toronto (CA)

(73) Assignee: Engineering Services Inc., Toronto (CA)

( * ) Notice: Subject to any disclaimer, the term of this patent is extended or adjusted under 35 U.S.C. 154(b) by 97 days.

(21) Appl. No.: 10/767,840

(22) Filed: Jan. 30, 2004

(51) Int. Cl.[7] ............................................. H01L 41/08
(52) U.S. Cl. .................. 310/316.01; 310/328; 310/800
(58) Field of Search .......................... 310/316.01, 321, 310/324, 328, 330, 339, 800

(56) References Cited

U.S. PATENT DOCUMENTS

| | | | |
|---|---|---|---|
| 6,379,393 B1 * | 4/2002 | Mavroidis et al. ............ 623/25 |
| 6,768,246 B2 * | 7/2004 | Pelrine et al. ............... 310/339 |
| 6,809,462 B2 * | 10/2004 | Pelrine et al. ............... 310/319 |
| 6,876,135 B2 * | 4/2005 | Pelrine et al. ............... 310/339 |
| 6,882,086 B2 * | 4/2005 | Kornbluh et al. ............ 310/328 |
| 6,891,317 B2 * | 5/2005 | Pei et al. ..................... 310/800 |

* cited by examiner

*Primary Examiner*—Mark Budd
(74) *Attorney, Agent, or Firm*—Nancy E. Hill; Hill & Schumacher

(57) ABSTRACT

A system for obtaining inline sensory feedback from an electroactive polymer based transducer for use in feedback control applications is disclosed. Specifically a method of obtaining sensory feedback from an electroactive polymer based transducer includes the steps of: receiving a user input in a control system, combining it with a control system feedback signal from a sensory feedback circuitry and producing a control signal; receiving the control signal in an amplifier and sensory tone generator, combining it with an amplifier feedback signal from the sensory feedback circuitry and producing a power signal; receiving the power signal and an environmental disturbance in an electroactive polymer transducer and sensory circuitry and responsive to the user input producing a sensory signal; receiving the sensory signal in the sensory feedback circuitry and producing the control system feedback signal and the amplifier feedback signal; and producing a data output in the control system.

36 Claims, 4 Drawing Sheets

SENSORY FEEDBACK SYSTEM FOR ELECTROACTIVE POLYMER BASED TRANSDUCERS

FIELD OF INVENTION

The present invention relates generally to an electroactive polymer based transducers and in particular electroactive polymer based transducers for use in inline sensory feedback and control system applications.

BACKGROUND OF THE INVENTION

Position and force feedback are crucial requirements for high performance industrial and consumer based control applications. Such applications include micro and nano positioning, human interactive robotics, multi-agent robotics, toys, soft tissue handling and animatronics.

Traditional transducers include AC and DC motors, pneumatic, solenoid and hydraulic actuators. Sensory feedback from traditional transducers is commonly provided by additional components such as strain gages, accelerometers, laser interferometers, encoders, potentiometers, LVDTs, pressure sensors, load cells, and additional electroactive sensors. Each of these components requires extra power and signal recovery circuitry. Furthermore, in space critical applications, the additional components commonly used to provide sensory feedback can interfere with the motion of the transducer and inhibit adequate operation of the device.

Active material based transducers are an alternative to the traditional transducers outlined above. Active material based transducers provide compact architectures for applications with limited space. In particular, electroactive polymers are active materials that commonly demonstrate high strain capability at lower pressures than piezoceramic or magnetostrictive transducers. Therefore, such materials are especially suitable for large strain applications such as those listed above. In applications involving electroactive polymer transducers, the traditional approach to obtaining sensory feedback by addition of sensory components is cumbersome and with large strain transducers some methods of obtaining feedback are seemingly impossible to implement. Furthermore, the addition of sensory elements to the transducer compromises the compact quality of electroactive polymer based devices that primarily attracts designers to these materials.

In view of the foregoing, an alternative, cost effective and compact electroactive polymer based transducer is desirable. Further, an electroactive polymer based transducer for the inline sensing of strain, pressure, and health monitoring for electroactive polymer based transducers is also desirable.

SUMMARY OF THE INVENTION

The present invention relates to a system for obtaining inline sensory feedback from an electroactive polymer based transducer for use in feedback control applications. The system infers strain, pressure and health of an electroactive polymer based transducer from real-time measurements of the electrical property changes.

In one embodiment, during operation of the transducer, the inherent electrical properties of the electroactive polymer transducer are monitored with sensory signals to determine information regarding the state of the transducer. These measurements may be made with and without the presence of the potentially high voltage control signal used to power the transducer. These measurements alone may be used to infer strain from the transducer in real-time position control applications.

In another embodiment, during operation of the transducer, both the high voltage signal applied to the transducer and the sensory signal may be measured and combined to infer both the strain state of the transducer and the electrostatic stress applied to the transducer in real-time. These measurements are then useful as feedback for real-time impedance control applications.

In an additional embodiment, the combined measurement of the sensory signal and the control signal may be further manipulated with a microprocessor to determine the external disturbances that may be applied to the transducer. This information may then be employed for real-time disturbance rejection or vibration suppression type control applications.

Furthermore, the sensory feedback system may be responsible for monitoring the health condition of the electroactive polymer transducer. In this case, in addition to the aforementioned measurements, the sensory system may monitor the power delivery to the electroactive polymer transducer. These measurements may be used to prevent dielectric breakdown of the transducer or to cease power delivery to the transducer in the event of dielectric breakdown or mechanical failure of the device. In this case, the sensory feedback system acts as a watchdog to ensure safe operation of the transducer.

The system responsible for making the foregoing measurements from an electroactive polymer transducer is comprised of an amplifying stage, a sensory feedback stage and a control stage. The amplifying stage includes a means by which to add the sensory signal to the control signal and provides power to the electroactive polymer transducer during operation. It also includes provision for an internal feedback control loop to improve the performance of the amplifying stage in supplying energy to the electroactive polymer transducer. The sensory feedback stage includes circuitry for obtaining the feedback signals from the electroactive polymer transducer with and without the presence of the control signal. It also comprises signal conditioning circuitry, control/sensory signal separation circuitry, electrical property message extraction circuitry, and transient surge protection circuitry. The control stage comprises a computer, microcontroller or programmable logic circuit capable of extracting the strain state information from the sensory feedback system with the assistance of a predetermined algorithm. Finally, the control stage also generates suitable control signals from the sensory signals obtained by the sensory stage with provision for user defined or pre-programmed commands.

BRIEF DESCRIPTION OF THE DRAWINGS

A more complete understanding of the invention and many of the achieved advantages thereof will be readily appreciated by reference to the following detailed description when considered in connection with the accompanying figures herein.

DETAILED DESCRIPTION OF THE PREFERRED EMBODIMENTS

Figure 1:
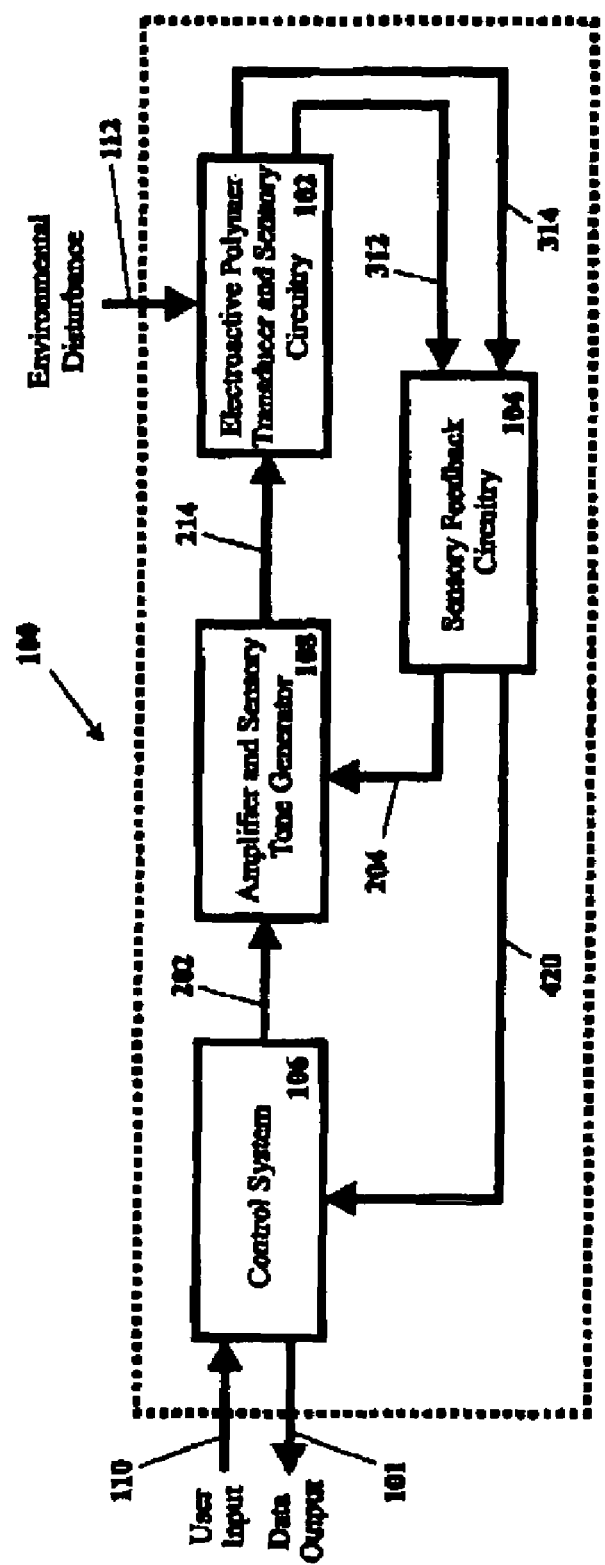
FIG. 1 is a block diagram of the sensory feedback and control system.

1. General Structure of the Sensory Feedback and Control System for the Electroactive Polymer based Transducer FIG. 1 is a block diagram for the sensory feedback and control system 100 for measuring the electrical properties of the electroactive polymer transducer and sensory circuitry 102. The user input 110 is integrated with the sensory feedback from the sensory feedback circuitry 104 within the control system 106. A control signal 202 from the control system 106 is delivered to the amplifier and sensory tone generator 108 where this signal is further combined with the internal feedback signal 204 from the sensory feedback circuitry 104 and an internally generated sensory tone within the amplifier and sensory tone generator 108 to produce the power signal 214. The power signal 214 is then delivered to the electroactive polymer transducer and sensory circuitry 102 in order to perform the task as dictated by the user input 10. During this process, the surrounding environment acts upon the dielectric elastomer transducer in the form of an environmental disturbance 112. The environmental disturbance 112 may or may not be known prior to the operation of the electroactive transducer. Both the power signal 214 from the amplifier and sensory tone generator 108 and the environmental disturbance 112 determine the response of the electroactive polymer transducer. This response in turn determines the changes in the electrical properties of the electroactive polymer transducer and as such also determines the electrical output from the electroactive polymer transducer and sensory circuitry 102. This sensory signal is recovered by the sensory feedback circuitry 104 and is further filtered and manipulated before returning to the control system 106 and the amplifier and sensory tone generator 108. Finally, the control system 106 extracts information from the sensory feedback signal and returns this information to the user as the data output 101.

The user input 110 may be provided from an external host computer or in the form of input from an external supervisory program. The user input 110 may be a position or force trajectory to be executed by the sensory feedback and control system 100 or it may be a command required to initiate completion of a pre-programmed trajectory or to configure the data output 101 required from the sensory feedback and control system 100.

The environmental disturbance 112 may represent a load applied directly to the mechanical output of the electroactive polymer transducer. In this case, the environmental disturbance 112 contributes to the strain state of the electroactive polymer transducer. It is also possible to monitor an environmental disturbance 112 that acts upon the active region of the electroactive polymer transducer. In this case, the environmental disturbance 112 may damage or risk damage to the electroactive polymer transducer and correspondingly decisions should be made within the control system 106 to prevent further damage to the electroactive polymer transducer or the surrounding environment. In this case, the sensory feedback circuitry 104 can detect rapid changes in power delivery to the electroactive polymer transducer, which are indicative of impending failure of the device under common operating conditions.

The data output 101 from the sensory feedback and control system 100 provides the user with critical information regarding the performance of the electroactive polymer transducer. This information may include real-time measurements of the electrical properties of the electroactive polymer transducer, current, voltage or power measurements from the amplifier and sensory tone generator 108, and health monitoring data required to ensure safe operation of the transducer.

2. Electrical Property Changes for the Electroactive Polymer Transducer

The global electrical properties of the electroactive polymer transducer change during the operation of the device. The sensory feedback and control system extracts this information from the transducer in real-time. An electroactive polymer transducer consists of two or more electrodes sandwiching a single or multiple polymeric layers. The electrical impedance of each electrode may change appreciably during operation of the device. The impedance of the polymeric layers may also change appreciably during the operation of the device. Furthermore, in some embodiments, both the electrode and the polymeric layer impedances change noticeably during operation. For a given device configuration, a correlation between the total strain of the transducer and the changes in the electrical properties of the electrodes, the polymeric layers, or a combination of the electrode and polymeric layers can be established.

Not wishing to be bound by any particular theory regarding the development of the correlation between strain and electrical property changes, a simplified example is presented below. The following example is specific to planar dielectric elastomeric transducers operated in pure shear deformation. An example of such is found in a co-pending U.S. application Ser. No. 10/644,894 filed Aug. 21, 2003 and entitled Stretched Rolled Electroactive Polymer Transducer and Method of Producing Same, wherein a planar transducer in pure shear is operationally equivalent to a ring type rolled transducer with a very thin electroactive polymer layer. The very thin electroactive polymer layer is generally less than 5% of the thickness of the entire roll. For a dielectric elastomer based polymeric layer, if the relative dielectric permittivity of the elastomer remains approximately constant during conformational changes, then the capacitance change for the film can be related approximately to the axial strain and the initial capacitance of the polymeric layer by the following formula:

$$C = C_0 \cdot (\epsilon+1)^2$$

Here C embodies the operational capacitance of the polymeric layer, $C_0$ indicates the initial capacitance of the polymeric layer and $\epsilon$ represents the axial strain experienced by the polymeric layer during operation.

In another example, a single ring rolled dielectric elastomer based transducer such as that described above in regard to the co-pending application is operated in pure shear deformation. In this example the rolled electroactive polymer transducer has a relatively thick active layer that is generally greater than 5% of the total diameter of the roll. The correlation between the axial strain $\epsilon$ and the capacitance C of the polymer layer in a single ring rolled dielectric elastomer based transducer can be approximated as:

$$C = \frac{2C_o(\varepsilon+1)\ln(\kappa)}{\ln\left[1 + \dfrac{\kappa^2-1}{\varepsilon+1}\right]}$$

where $\kappa$ is the ratio between the inner and outer diameters of the rolled polymeric layer. In the case where the inner diameter of the layer approaches zero, the relationship approximately becomes:

$$C=C_0(\epsilon+1)$$

which is a linear relationship. In another case, where the thickness of the rolled electroactive polymeric layers are sufficiently thin, the relationship becomes approximately equal to that of the planar transducer:

$$C=C_0\cdot(\epsilon+1)^2$$

In the case that the inference of the applied electrostatic pressure is required from the electroactive polymer transducer, both the voltage and capacitance can be measured simultaneously. A correlation similar to the ones presented in the foregoing paragraphs can be established for a given transducer morphology. As an example, the electrostatic pressure during operation of a planar dielectric elastomer based transducer under pure shear can be approximated by:

$$P_e = \frac{Cv^2}{h_o A_o}$$

where $r_e$ is the electrostatic pressure, C is the operational film capacitance, v is the applied high voltage signal, $h_0$ is the initial polymeric layer thickness, and $A_0$ is the initial electroded surface area.

In these examples, the correlation between the strain state of the polymeric layer and the electrical capacitance of the layer is based on classical electrostatic theory. Many other means of determining the correlation between the electrical property measurement and the strain state can be implemented such as by making independent in situ measurements for a particular device. These measurements are then used in establishing the required correlation by incorporating the independent measurements in conjunction with a lookup table, polynomial fit, neural network fit, fuzzy model fit or any other regression procedure.

As stipulated above, for a given device configuration, a correlation between the total strain of the transducer and the changes in the electrical properties of the electrodes, the polymeric layers, or a combination of the electrode and polymeric layers can be established. In the above examples, the correlation between the strain-state and the electrical capacitance of the polymeric layer has been exemplified. For electrodes, equivalent correlation to this presented herein for the polymeric layers can be established based on the changes of the electrical properties of the electrodes during conformational changes of the transducer. An example is presented below for a wide group of carbon powder based electrodes (e.g., carbon conducting grease (CW7100), conducting RTV silicone (RTV 60-CON), silver conducting grease (CW7300), and graphite powder (S4)). The relationship between the strain and the resistance of a carbon powder based electrode can be established experimentally or approximated theoretically. From experiments, the relationship between strain and resistance of a carbon powder based electrode under uniaxial extension is approximated by the relationship:

$$R=R_0\cdot(\gamma)$$

where R is the present electrode resistance, $R_0$ is the initial electrode resistance, $\epsilon$ is the axial strain, and $\gamma$ is a material and geometry dependent parameter measured by the relationship:

$$\gamma = \frac{R_i}{R_o}$$

where $R_i$ is the electrod resistance measured at a strain equal to 100%. The values of $\gamma$ for a common geometry and various electrode materials are $\gamma=4$ for carbon conducting grease (CW7100), $\gamma=6.5$ for conducting RTV silicone (RTV 60-CON), $\gamma=6.8$ for silver conducting grease (CW7300), and $\gamma=22$ for graphite powder (S4). The relationship between resistance and strain can then be used either in conjunction with capacitance measurements or separately to distinguish the strain state of the electroactive polymer transducer during operation.

The decision as to which properties to measure depends on the specific configuration of any embodiment of the transducer. For example, grease based electrodes tend to undergo irreversible flow during the operation of the transducer and as such, the measurement of the electrical properties of the electrodes would not be warranted in this case and instead, measurements of the polymeric layer capacitance should be made. In another embodiment, if conductive particle impregnated elastomeric electrode materials are used, the electrode resistance can be accurately and reliably measured during real-time operation. In this case it is convenient to measure the electrode resistance instead of the polymeric layer capacitance during operation.

Once the correlation is established for a particular electroactive polymer transducer, measurements involving this correlation can be made with the sensory feedback circuitry 104.

3. General Structure of the Control System

The control system 106 receives user input 110 and control feedback signals 420 from the sensory feedback circuitry 104 to generate a control signal 202, which is then sent to the amplifier and sensory tone generator 108, and data output 101. The signal 202 that is sent to the amplifier and sensory tone generator 108 is applied to the electroactive polymer transducer. The data output 101 is used for feedback to the user, information storage, health monitoring information, etc.

In one embodiment, the internal structure of control system 106 also comprises a suitable control algorithm used in the feedback control loop. In this case, the control architecture operates in the closed-loop mode to improve the performance of the electroactive polymer transducer. The improved performance relates to increasing the bandwidth, improving the positioning or force control accuracy, or improving the disturbance rejection of the transducer. The control algorithm is derived for the particular morphology of the transducer specific to a particular application. The algorithm may also be developed based on any of numerous control theories well known to those skilled in the art. In one particular embodiment, a tuned PID control algorithm may be used to control the response of the electroactive polymer transducer. The resulting algorithm is implemented in a computer program, a microcontroller, analog circuitry or a programmable logic circuit within the control system 106 for the purposes of closed loop control of the electroactive polymer transducer.

In another embodiment, the control system 106 comprises a means for implementing the correlation between strain state and electrical property measurements from the electroactive polymer transducer. For example, the correlation between the strain and capacitance measurements indicated earlier may be implemented in real-time software operating on a host computer that, itself, embodies the control system 106. In another example, the correlation may be pre-programmed on a PIC microprocessor or equivalent. Furthermore, the correlation may be hard wired in the form of functional analog electronics. For the example provided earlier, an analog square root circuit may be tuned to exhibit the required correlation between electrical property measurements from a strain state of the electroactive polymer transducer.

In yet another embodiment, the control system 106 comprises both a means of implementing the correlation between the strain state and electrical property measurement from the electroactive polymer transducer and a suitable control algorithm for feedback control of the device. In this case the algorithm and correlation may be implemented together in a single microprocessor, computer program etc. or implemented individually within the same control system 106.

In a further embodiment, the control system 106 comprises both a means of implementing the relationship between the strain and the stress states and the corresponding measurements of the applied voltage and electrical properties of the electroactive polymer transducer. Furthermore, the embedded correlation may be combined with a control algorithm for impedance control of the transducer.

In yet another embodiment, the control system 106 comprises a means of inferring the strain and stress states from applied voltage and electrical measurements from the transducer. In addition the control system 106 comprises a means of inferring disturbances applied to the transducer during operation. The resulting algorithm may be used in conjunction with a control algorithm to perform disturbance rejection with the electroactive polymer transducer.

In another embodiment, the control system 106 includes a means of monitoring the health of the electroactive polymer transducer. In one example, the aforementioned control system includes circuitry suitable for monitoring the current delivery to the electroactive polymer transducer. If the current exceeds some predefined maximum, due to the initiation of a dielectric breakdown process in the transducer or due to damage to the transducer from an external source, an emergency process is triggered in the remainder of the control system 106. This process may shut down the amplifier, limit the voltage applied to the amplifier or recoil the transducer by modifying the control signal or it may communicate the problem to the user through the data output 101.

In yet another embodiment, the control system 106 passes the user input 110 directly through to the amplifier and sensory tone generator 108. In this case, the control system 106 is invisible to the forward loop of the sensory feedback and control system 100. This configuration is useful for applications where the user input 110 is a function generator and the sensory feedback and control system 100 is used to characterize the electroactive polymer transducer. The control system 106 may include provision for passing the sensory signals from the sensory feedback circuitry 104 through to the user via data output 101.

4. General Structure of the Amplifier and Sensory Tone Generator

Figure 2:
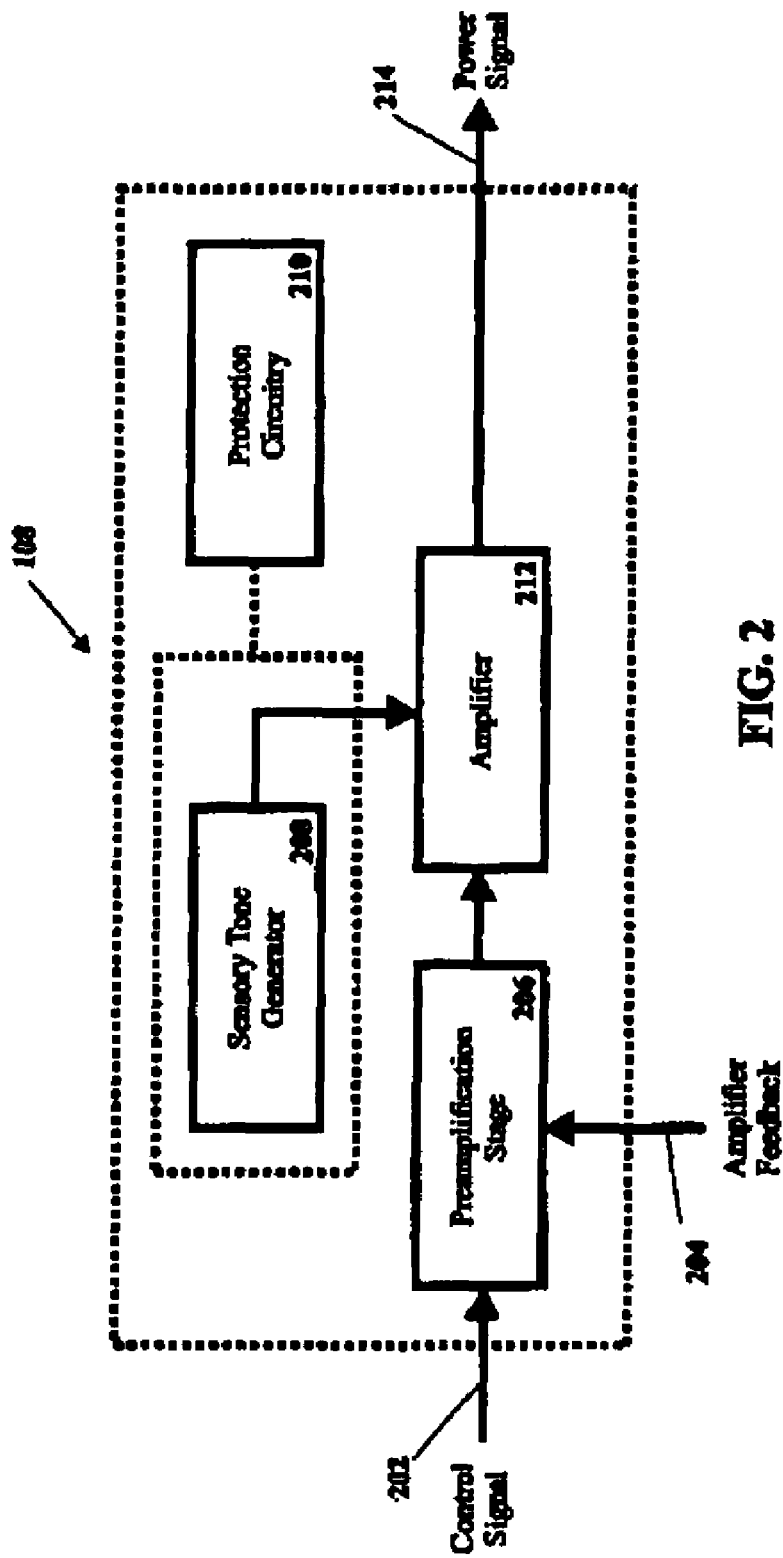
FIG. 2 is a block diagram of the amplifier and sensory tone generator.

FIG. 2 outlines the general structure of the amplifier and sensory tone generator 108. The control signal 202, provided by the control system 106, is combined with the amplifier feedback 204 from the sensory feedback circuitry 104 in the preamplification stage 206. The preamplification stage 206 further acts as a buffer for the control signal 202 and the amplifier feedback 204 and passes the complete signal on to the amplifier 212. The amplifier 212 combines the signal from the preamplification stage 206 with the signal created by the sensory tone generator 208 into the completed power signal 214 that is delivered to the electroactive polymer transducer and sensory circuitry 102. The protection circuitry 210 provides over-voltage protection to the sensory tone generator 208 in the event of a transient power surge through the system due to the accidental dielectric breakdown of the electroactive polymer transducer during operation.

The preamplification stage 206 combines the control signal 202 and the amplifier feedback 204 to generate the low voltage signal that will be amplified to drive the electroactive polymer transducer. The preamplification stage 206 also acts as a power buffer for both the control signal 202 and the amplifier feedback 204. This stage comprises circuitry suitable for the combination of the control and feedback signals and further provides the control algorithm for the internal feedback loop. The internal feedback control algorithm may be of any general form. In one example, the control algorithm simply provides proportional feedback control of the voltage applied to the electroactive polymer transducer. This feedback improves the bandwidth capability of the amplifier 212 at the expense of the range of the output voltage.

In another embodiment, the preamplification stage comprises circuitry suitable for the combination of the control signal 202 and the amplifier feedback 204 with provision for a control algorithm and voltage limiting circuitry. The voltage limiting circuitry provides a means of protecting the electroactive polymer transducer from accidental over-voltages created by the amplifer 212.

The sensory tone generator 208 creates the sensory tone that is used to extract the electrical property data from the electroactive polymer transducer. The sensory tone is a low voltage signal with amplitude between 1 mV and 10V. The sensory tone may be created anywhere between 1 Hz to 1 MHz with the optimal frequency for the tone being determined by the specifics of an application. These specifics are defined by both the detailed design of an electroactive polymer transducer (e.g., its polymeric material and design arrangements) and the intended use (e.g., desired precision of positioning and force control, desired sensing specifications for strain, pressure, and health monitoring). The sensory tone generator 208 can be comprised of function generating, pseudo-sine wave generating, or sine wave generating circuitry.

In the case that the sensory tone generator 208 comprises a function generator, the function generator may be any general function generator. For example, the function generator may be a BK Precision 4011A 5 MHz function generator or equivalent. In applications requiring high precision, an Agilent 33120A 15 MHz Function/Arbitrary waveform generator may be used as the function generator.

In the case that the sensory tone generator 208 comprises pseudo-sine wave generating circuitry, the circuitry may be of the wave shaping type or may be an oscillator such as a Wien bridge sine wave oscillator. Filtering the harmonic content from a square wave signal may also create an appropriate sensory tone. Furthermore, a single chip such as the XP 2205CP Sine Wave Generator, the ML2035 Serial Input Programmable Sine Wave Generator from Fairchild Semiconductor, or the AD2S99 Oscillator from Analog Devices among others may embody the circuitry of the sensory tone generator 208. In the case that the sensory tone is created using a low power oscillator, the output from the oscillator may have to pass through a power amplifier before being delivered to the amplifier 212.

The amplifier 212 creates a sufficiently high voltage power signal in sync with the input signals to drive the electroactive polymer transducer. The output from the amplifier 212 should be tailored to specific application at hand. The output voltage requirements commonly range between 0–20 kV while the power requirements for driving electroactive polymer transducers commonly range from 10 mW to 10 kW. The exact voltage and power demand for any application is dependant on the dimensions of the electroactive polymer transducer, the capacitance of the transducer, and the bandwidth requirements for the application. In applications with low power demands, a low power DC—DC converter may embody the amplifier 212. An example of such a converter is the DX200 DC—DC converter available from EMCO High Voltage. This converter outputs a signal between 0–20 kV given an input ranging between 0–12V.

The signal created by the sensory tone generator 208 is combined with the output from the preamplification stage 206 at the amplifier 212. The signals may be combined at the input to the amplifier 212 or at the output from the amplifier 212.

The signals are combined at the input to the amplifier 212 in cases where the amplifier 212 requires an earth ground reference for the output signal or where the power demands are such that the safe combination of signals at the output from the amplifier 212 is not possible. The DX200 DC—DC converter should have an earth grounded reference for the output signal. As such, the sensory signal cannot be easily added to the output signal without extra circuitry. Therefore, the sensory signal should be added to the output from the preamplification stage 206 at the input to the amplifier 212. In this case, the sensory signal should be much smaller than the output from the preamplification stage 206.

In one embodiment, the sensory tone is added to the output of the preamplification stage 206 at the input to the amplifier 212. The sensory tone has an amplitude between 1–10 mV while the preamplification stage 206 output has an amplitude between 0–12V. For this type of implementation, the sensory signal should be as consistent as possible to ensure that the power signal 214 generated by the amplifier 212 contains an easily recoverable sensory tone. In the case where the signals are added at the input to the amplifier 212, the protection circuitry 210 is not essential for the protection of the sensory tone generator 208.

The signals are combined at the output from the amplifier 212 in cases where the amplifier 212 has significant isolation between the input and output stages and where the power demands from the amplifier 212 are low enough that the safety during accidental dielectric breakdown of the electroactive polymer transducer can be minimized. The Q101-5 DC—DC converter available from EMCO High Voltage is capable of this type of operation. This DC—DC converter can maintain output isolation of up to 500V from the ground referenced input signal.

In this case, the sensory tone generator 208 can be connected directly to the reference of the power signal 214 from the amplifier 212. The sensory tone is much larger in this case as compared to the case where it is added at the input to the amplifier 212. If added to the output from the amplifier 212, the sensory tone has an amplitude between 500 mV –20V. The amplitude of the sensory tone is small in comparison to the high voltage output from the amplifier 212. As such, the sensory tone does not contribute significantly to the transduction of the electroactive polymer transducer. In the case that the sensory tone is added to the output of the amplifier 212, the consistency of the sensory tone does not have to be as accurate as when it is added to the input to the amplifier 212. Although, in this case, the sensory tone generator 208 should be protected from transient surges that may occur due to the accidental dielectric breakdown of the electroactive polymer transducer.

The protection circuitry 210 provides a means of protecting the sensory tone generator 208 from transient surges that may propagate through the system in the event that the electroactive polymer transducer should fail during operation. The protection circuitry 210 may be embodied by a series of nonlinear resistors, varistors or zener diodes or a combination of such circuit elements. In one embodiment, the protection circuitry 210 comprises the parallel combination of a pair of 1N4743A zener diodes and an ERZ-V05D180 Transient/Surge Absorber available from Panasonic. The zener diodes offer a first defence against a transient power surge and the Transient/Surge Absorber provides the second defence in case the zener diodes fail due to the power surge. The Transient/Surge Absorber comprises a capacitive component and a nonlinear resistive component that together provide a very large load for transient surges but present a relatively small load for the sensory tone generator 208. The protection circuitry 210 may be significantly more complex than the example provided here or may simply comprise a pair of zener diodes.

In the case that the amplifier 212 is comprised of a DC—DC converter or a voltage amplifier of similar structural makeup, the amplifier 212 automatically generates a high frequency tone that is superimposed on the power signal 214. This tone is usually a by-product of the circuitry used in these devices to create the high voltage signal. In one example, a Q101-5 DC—DC converter creates a triangular low voltage signal, less than 100V in amplitude, with a fundamental frequency of a low voltage of approximately 60 kHz. In cases where the electrical properties of the electroactive polymer transducer favour the application of a sensory tone in the range of 50–75 kHz or more, the low voltage output from the amplifier 212 may embody the sensory signal and the extra sensory tone generator 208 is not required. Furthermore, some DC—DC converters produce a high frequency, low voltage tone that is closer to a pseudo sine wave than the Q101-5. Such DC–DC converters, such as the DX200 are preferred over the Q101-5 in applications where the amplifier 212 internally generates the sensory tone. Ideally, the existing DC—DC converters would be modified to supply an accurate sine wave sensory tone at a tuneable frequency without the need for any extra circuitry.

5. General Structure of the Elastomer Transducer and Sensory Circuitry

Figure 3:
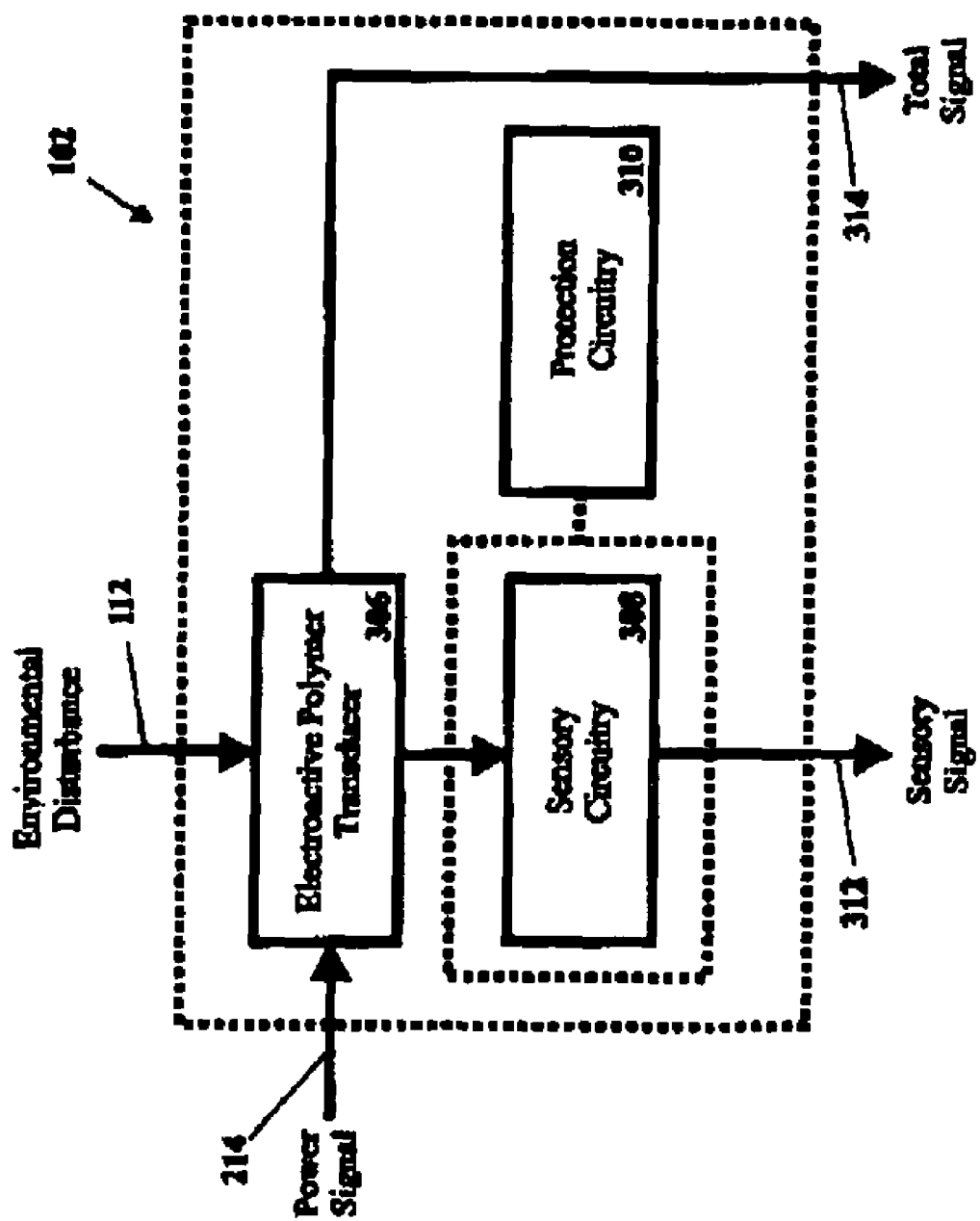
FIG. 3 is a block diagram of the electroactive polymer transducer and sensory circuitry.

FIG. 3 is a block diagram of the electroactive polymer transducer and sensory circuitry 102 and the connections between this system and the surroundings. The power signal 214, provided by the amplifier and sensory tone generator 108, is applied to both the electroactive polymer transducer 306 and the sensory circuitry 308. The electroactive polymer transducer 306 responds to the combined influence of the power signal 214 and the environmental disturbance 112. The electroactive polymer transducer 306 responds to these influences by changing shape. This shape change causes the aforementioned variation in the electrical properties of the electroactive polymer transducer 306. The amplitude of the sensory signal 312, from the sensory circuitry 308, changes in response to the electrical property variation of the electroactive polymer transducer 306. The total signal 314 is recovered from the combination of the electroactive polymer transducer 306 and the sensory circuitry 308 in the case that the power signal 214 is required for feedback control or that the power signal 214 is not strong enough to ensure that the amplitude content of the sensory signal is maintained during normal operation of the electroactive polymer transducer 306. The protection circuitry 310 provides transient surge protection to the sensory circuitry 308 in the event of accidental dielectric breakdown of the electroactive polymer transducer 306 during operation.

The electroactive polymer transducer 306 is comprised of at least one polymeric layer encapsulated between two or more compliant electrodes. The electroactive polymer transducer 306 is interfaced to the surrounding environment via mechanical attachments. The surrounding environment interacts with the electroactive polymer transducer 306 by means of an external disturbance 112. This disturbance may be the load that is driven by the electroactive polymer transducer 306, or it may also comprise an unexpected disturbance.

The sensory circuitry 308 is used to create the sensory signal that monitors the electrical property changes of the electroactive polymer transducer 306. The sensory circuitry 308 is designed as the first stage for the extraction of the sensory signal 312. As such, the proper design of the sensory circuitry 308 is crucial for the effective operation of the sensory feedback and control system.

In one embodiment, the sensory signal 312 is selected for a frequency spectrum in excess of that reserved for the control signal content. In this case, the sensory circuitry 308 is designed such that the power delivery to the electroactive polymer transducer 306 is not inhibited within the bandwidth prescribed for the control content of the power signal 214. The other requirement imposed on the design of the sensory circuitry 308 is that it creates a sufficiently wide pass band within the frequency spectrum designated for the placement of the sensory tone. Furthermore, it is important to define a correlation between the changes in the sensory signal 312 to the electrical property changes of the electroactive polymer transducer 306 within the pass band frequency spectrum. The other requirement imposed on the design of the sensory circuitry 308 is that it also prevents amplification of high frequency noise due to switching circuitry and during accidental transient surges. The electrical properties of the protection circuitry 310 should also be examined during the design of the sensory circuitry 308. There are many embodiments of the sensory circuitry 308 that can be tailored to achieve the aforementioned requirements. In one embodiment, the sensory circuitry 308 comprises the parallel connection of a capacitor and a resistor.

The capacitor and the resistor are selected for a particular electroactive polymer transducer 306 based on the electrical properties of the transducer without the applied power signal. In one case, the electrical properties of the electroactive polymer transducer 306 without applied voltage can be approximated as a series connection of a resistor and a capacitor. Particular to the example presented here, the capacitance of the electroactive polymer transducer 306 is $C_0=132pF$ and $R_0=10.5k\Omega$. The electrical properties of the electroactive polymer transducer 306 change under the applied voltage as approximated by the correlations presented earlier. Assuming that the control signal spectrum is sufficiently lower than that reserved for the sensory tone, the design of the sensory circuitry 308 can be approached using small signal analysis of the electrical circuitry comprising the electroactive polymer transducer 306 and the sensory circuitry 308.

Using small signal analysis, the transfer function relating the power signal 214 to the sensory signal 312 is defined for the simple example of a parallel connection of a capacitor and resistor by:

$$\frac{v_o(s,\varepsilon)}{v_{in}(s,\varepsilon)} = \frac{R_s C(\varepsilon)s}{R_s R(\varepsilon) C_s C(\varepsilon)s^2 + \{R_s(C_s + C(\varepsilon)) + R(\varepsilon)C(\varepsilon)\}s + 1}$$

where $v_0$ is the sensory content of the power signal 214 applied to both the electroactive polymer transducer 306 and the sensory circuitry 308 and $v_{in}$ is the sensory signal 312. The sensory circuitry electrical parameters for the resistor and capacitor are designated by $R_0$ and $C_S$ respectively. To satisfy the predetermined requirements for the sensory circuitry 308 demonstrated by this example, the properties of the sensory circuit should be selected according to: {PARA0}

$$\omega_s \equiv \frac{1}{R_s C_s} << \omega_{DET} \equiv \frac{1}{R(\varepsilon)C(\varepsilon)}$$

$C_S >> C(\epsilon)$ $R_S \approx R(\epsilon)$

After these conditions are determined for the parameters of the sensory circuitry 308, the sensory signal 312 can be related to the total signal 314 by the approximate relationship:

$$\frac{V_o(s)}{V_{in}(s,\varepsilon)} \approx \frac{C(\varepsilon)}{C(\varepsilon)+C_s},$$

and in the case where the sensory capacitor designated $C_S$ is much larger than the capacitance of the electoactive polymer transducer 306 then the above relationship can be further reduced to:

$$\frac{V_o(s)}{V_{in}(s,\varepsilon)} \approx \frac{C(\varepsilon)}{C_s}$$

and a linear relationship can be established between the capacitance change in the electroactive polymer transducer 306 and the change in amplitude of the sensory signal 312.

In another embodiment, the resistance change of the electrodes for the electroactive polymer transducer 306 can be monitored using similar concepts with differently selected sensory circuitry 308. A design methodology similar to that presented herein would be clear to those skilled in the art.

In yet another embodiment, both the resistance change of the electrodes and the capacitance change of the polymeric layer can be measured in combination from the electroactive polymer transducer 306 to infer its strain state. A design methodology similar to that presented herein would be clear to those skilled in the art.

The protection circuitry 310 provides a means of protecting the sensory circuitry 308 from transient surges that may propagate through the system in the event that the electroactive polymer transducer 306 should fail during operation. The protection circuitry 310 may be embodied by a series of nonlinear resistors, varistors or zener diodes or similar protective circuit elements. In one embodiment, the protection circuitry 310 comprises the parallel combination of a pair of 1N4743A zener diodes and an ERZ-V05D180 Transient/Surge Absorber available from Panasonic. The zener diodes offer a first defence against a transient power surge and the Transient/Surge Absorber provides the second defence in case the zener diodes fail due to the power surge. The Transient/Surge Absorber comprises a capacitive component and a nonlinear resistive component that together provides a very large load for transient surges. The electrical properties of these components should be considered in the design of the sensory circuitry 308 as they can have an effect on the overall properties of the transfer function for the sensory signal 312. The protection circuitry 310 may be significantly more complex than the example provided here or may simply comprise a pair of zener diodes.

6. General Structure of the Sensory Feedback Circuitry

Figure 4:
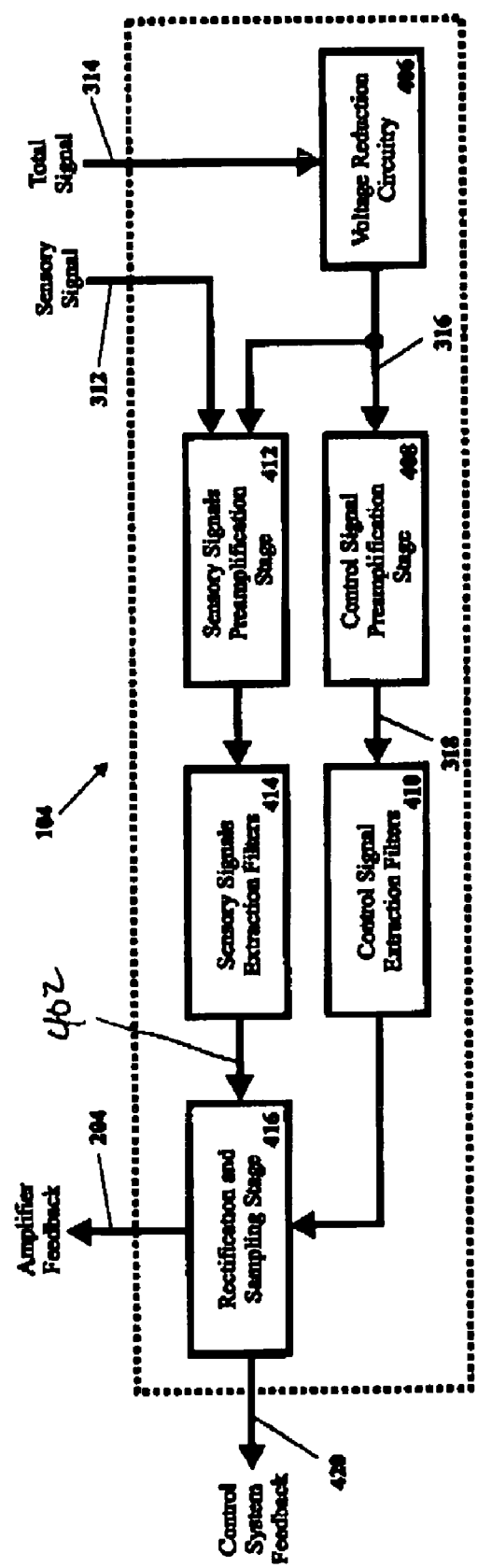
FIG. 4 is a block diagram of the sensory feedback circuitry.

FIG. 4 is a block diagram of the sensory feedback circuitry 104. The total signal 314 is measured from the electroactive polymer transducer and sensory circuitry. The amplitude of the total signal 314 is safely divided to a predetermined scale by the voltage reduction circuitry 406. The reduced total signal 316 is then sent to the control signal preamplification stage 408 and the sensory signals preamplification stage 412 for signal conditioning. The sensory signal 312 is measured from the sensory circuitry and delivered immediately to the sensory signals preamplification stage 412. The control signal preamplification stage 408 buffers and amplifies the reduced total signal 316 generated by the voltage reduction circuitry 406. The amplified total signal 318 from the control signal preamplification stage 408 is then sent to the control signal extraction filters 410 where the control signal content is extracted from the amplified total signal 318 generated by the control signal preamplification stage 408. The recovered and conditioned control signal generated by the control signal extraction filters 410 is then sent to the rectification and sampling stage 416 where it is routed either to the control system 106 via the control system feedback 420 or to the amplifier and sensory tone generator 108 via the amplifier feedback 204. The sensory signal 312 is amplified and buffered in the sensory signals preamplification stage 412 and then sent through to the sensory signals extraction filters 414 where any remnants of the control signal or high frequency noise are removed from the sensory signal. The amplified and filtered sensory signal 402 generated by the sensory signals extraction filters 414 is then sent to the rectification and sampling stage 416 where the electrical property measurements from the electroactive polymer transducer are extracted from the sensory signal 402. Finally, the extracted signal content is routed to the control system 106 or the amplifier and sensory tone generator 108 via the control system feedback 420 or the amplifier feedback 204, respectively.

The voltage reduction circuitry 406 reduces the potentially high voltages associated with the total signal 314 to amplitudes that are safe for the remaining low voltage circuitry. Common operating voltages for the total signal 314 range from 0 to 20 kV and the voltage reduction circuitry 406 reduces the amplitude of this signal to within the common range of 0 to 20V. The reduced total signal 316 generated by voltage reduction circuitry 406 can then be safely monitored and manipulated by the remaining low voltage circuitry. There are several embodiments of the voltage reduction circuitry 406 that may satisfy the criteria outlined above. Someone familiar with the art could implement several various embodiments for the voltage reduction circuitry 406. In a particular embodiment, the voltage reduction circuitry 406 is comprised of a 1000:1 voltage divider model V1G available from EMCO High Voltage.

The reduced total signal 316 generated by voltage reduction circuitry 406 is sent to the control signal amplification stage 408. This stage is responsible for buffering the reduced total signal 316 and preamplifying this signal in preparation for the control signal extraction filters 410. In many cases the buffering amplifiers within the control signal preamplification stage 408 will contain an active shield to protect the sensitive output of the voltage reduction circuitry 406 from stray capacitance and board resistance. It is understood that this form of buffering may be performed by many varieties of circuitry familiar to someone skilled in the art. In one instance the reduced total signal 316 is buffered and shielded by one channel of the quad operational amplifier TL084 available from STMicroelectronics. Furthermore, the amplification stages within the control signal amplification stage 408 modify the buffered signal to optimize the amplitude of the signal for the control signal extraction filters 410.

After being buffered and amplified, the reduced and amplified total signal 318 generated by the control signal preamplification stage 408 is sent to the control signal extraction filters 410. The control signal extraction filters 410 remove the residual sensory tone and high frequency noise from the reduced and amplified total signal 318 leaving only the control signal for feedback to the control system. The control signal extraction filters 410 comprise a series of low pass filters to adequately remove the high frequency content from the reduced and amplified total signal 318 leaving only the portion of the signal responsible for the control of the electroactive polymer transducer. The filters may be designed using a variety of components including digital signal processors, analog filters, active filters, and digital filters among others. In one embodiment the control signal extraction filters 410 comprise a series of $2^{nd}$ order switched capacitor filtering stages. The filters are implemented on LMF100 switched capacitor filters available from National Semiconductor. The circuitry is configured as staged $2^{nd}$ order notch-low pass filter and high-Q low pass filters to remove the sensory signal 312 content from the total signal 314 and remove all high frequency noise from the signal. This leaves only the control signal content at the output of the control signal extraction filters 410. This signal is sent onto the rectification and sampling stage 416 for rerouting.

The sensory signal 312 is delivered directly to the sensory signals preamplification stage 412. The sensory signal preamplification stage 412 includes provision to accept sensory signal content from both the sensory signal 312 and the reduced total signal 316. This is required in the case where the amplifier cannot consistently supply the sensory tone to the electroactive polymer transducer or in cases where a transient surge is propagated through the system due to dielectric breakdown of the electroactive polymer transducer. In cases where these events are not likely to occur, the sensory signals preamplification stage 412 may only accept the sensory signal 312. In either case, the signals are amplified in this stage of the circuitry. The amplification acts both as a buffer and to modify the input voltages to an acceptable range for the sensory signals extraction filters 414. This circuitry stage is similar in nature to the control signal preamplification stage 408. In this sense, the circuitry used in each stage can be common to both. In one embodiment, sensory signal 312 is buffered and amplified by multiple channels of a quad operational amplifier TL084 available from STMicroelectronics. After preamplification stage 412, the sensory signal 312 and the reduced total signal 316 are delivered to the sensory signals extraction filters 414.

The sensory signals extraction filters 414 remove the control signal content and noise residuals from the sensory signal 312 and potentially from the total reduced signal 316. The sensory signals extraction filters 414 comprise a series of band pass filters to adequately remove the high frequency content from the amplified sensory signal 312 and the total reduced and amplified signal leaving only the portion of the signal responsible for the sensory feedback from the electroactive polymer transducer. The filters may be designed using a variety of components including digital signal processors, analog filters, active filters, and digital filters among others. In one embodiment the sensory signals extraction filters 414 comprise a series of $2^{nd}$ order switched capacitor filtering stages. The filters are implemented on LMF100 switched capacitor filters available from National Semiconductor. The circuitry is configured as staged $2^{nd}$ order band pass filters to remove the control signal content from the amplified sensory signal 312 and the total reduced and amplified signal and remove all high frequency noise from the signals. This leaves only the sensory signal content at the output of the sensory signals extraction filters 414. The signals 402 are sent onto the rectification and sampling stage 416 for further modification and rerouting.

The rectification and sampling stage 416 extracts the electrical measurement content from the feedback signals from the electroactive polymer transducer. In one embodiment, the sensory tone is a high frequency tone used to extract the electrical information from the electroactive polymer transducer. In this case, the rectification and sampling stage 416 removes the high frequency sensory tone from the sensory signals and leaves the electrical measurement signal. The sensory tone is the carrier and the electrical measurements represent the message, encoded as the amplitude modulation of the sensory tone. To remove the electrical measurements from the sensory tone, a wide variety of demodulation schemes may be employing. In particular, in one embodiment, a synchronous demodulation scheme is used to extract the electrical measurements from the sensory signals. To enhance the frequency response of the output signal, the signal is rectified and sampled. The rectification of the sensory signal can be achieved using many different methods familiar to one skilled in the art. In one embodiment the signal is rectified using an active rectification circuit. After rectification, the envelope is representative of the electrical measurements and should be extracted from the completed signal. This task can be performed by a number of envelope detection schemes. For example, the envelope can be detected using a passive envelope detection scheme. In another embodiment, the envelope detection scheme is done by synchronously resampling the rectified signal at successive peaks in the carrier. This task is performed using multiple LM339 comparators, a LMC555 timing circuit and a LF398 sample and hold circuit available from National Semiconductor. This procedure significantly reduces the phase lag between the detected envelope and the actual envelope over passive envelope detection schemes.

The rectified signal is filtered using a variety of passive or active filters to remove any high frequency noise introduced by the sensory signals extraction filters 414 and the rectification and sampling stage 416.

After extraction of the electrical measurement content, the signals are rerouted to the amplifier and sensory tone generator in the form of the amplifier feedback 204 and to the control system in the form of the control system feedback 420, thereby completing the control loop and delivering sensory information from the electrical property changes of the electroactive polymer transducer to the control system 106 and the amplifier and sensory tone generator 108.

As used herein, the terms "comprises" and "comprising" are to be construed as being inclusive and opened rather than exclusive. Specifically, when used in this specification including the claims, the terms "comprises" and "comprising" and variations thereof mean that the specified features, steps or components are included. The terms are not to be interpreted to exclude the presence of other features, steps or components.

It will be appreciated that the above description related to the invention by way of example only. Many variations on the invention will be obvious to those skilled in the art and such obvious variations are within the scope of the invention as described herein whether or not expressly described. Further, other embodiments and modifications of the present invention may be possible in light of the foregoing exposition. Therefore, it is to be understood that the present invention is not to be limited to the exposition presented and that such further embodiments and modifications are intended to be included in the scope of the appended claims.

What is claimed as the invention is:

1. A method of obtaining sensory feedback from an electroactive polymer based transducer comprising the steps of:
   receiving a user input in a control system, combining it with a control system feedback signal from a sensory feedback circuitry and producing a control signal;
   receiving the control signal in an amplifier and sensory tone generator, combining it with an amplifier feedback signal from the sensory feedback circuitry and producing a power signal;
   receiving the power signal and an environmental disturbance in an electroactive polymer transducer and sensory circuitry and responsive to the user input producing a sensory signal;
   receiving the sensory signal in the sensory feedback circuitry and producing the control system feedback signal and the amplifier feedback signal; and producing a data output in the control system.

2. The method as claimed in claim 1 wherein the data output includes a strain-state of the electroactive polymer transducer.

3. The method as claimed in claim 2 wherein the strain-state is determined from the sensory signal.

4. The method as claimed in claim 1 wherein the data output includes a pressure-state of the electroactive polymer transducer.

5. The method as claimed in claim 4 wherein the pressure-state is determined from a combination of the sensory signal and a feedback of the power signal.

6. The method as claimed in claim 1 wherein the data output includes a health-state of the electroactive polymer transducer.

7. The method as claimed in claim 6 wherein the health-state is determined by monitoring a current in the transducer and determining if the current is above a predetermined level and if so the health of the transducer is compromised.

8. The method as claimed in claim 6 wherein the health-state is determined from a combination of the sensory signal and a feedback of the power signal.

9. The method as claimed in claim 1 wherein the data output includes a combination of a strain-state, a pressure-state, and a health-state of the electroactive polymer transducer.

10. The method as claimed in claim 9 wherein the combination of the strain-state, the pressure-state and the health-state is determined from a combination of the sensory signal and a feedback of the power signal.

11. The method as claimed in claim 1 wherein the electroactive polymer has electrical properties and the sensory signal measures the combined electrical properties of the electroactive polymer transducer and sensory circuitry.

12. The method as claimed in claim 1 wherein the sensory signal measures the capacitive property changes of the electroactive polymer transducer to infer a strain-state of the transducer.

13. The method as claimed in claim 1 wherein the sensory signal measures a resistive property changes of the electroactive polymer transducer to infer a strain-state of the transducer.

14. The method as claimed in claim 1 wherein the sensory signal measures a combination of a capacitive and resistive properties of the electroactive polymer transducer to infer a strain-state of the transducer.

15. The method as claimed in claim 6 wherein the electroactive polymer transducer has electrical properties and the sensory signal is a low voltage, high frequency tone used to measure the combined electrical properties of the electroactive polymer transducer and sensory circuitry.

16. The method as claimed in claim 1 wherein the sensory feedback circuitry comprises a means of extracting electrical property measurements of the electroactive polymer transducer from the sensory signal.

17. The method as claimed in claim 1 wherein the electroactive polymer transducer changes shape responsive to the power signal and the environmental disturbance.

18. The method as claimed in claim 1 wherein the electroactive polymer transducer and sensory circuitry further produces a total signal.

19. The method as claimed in claim 1 wherein the electroactive polymer transducer and sensory circuitry further includes a protection circuitry.

20. The method as claimed in claim 1 wherein the user input is from a host computer.

21. The method as claimed in claim 1 wherein the user input is one of a position trajectory, a force trajectory, a combination position and force trajectory, a command to initiate completion of a preprogrammed trajectory and a command to confirm data output.

22. The method as claimed in claim 1 wherein the environmental disturbance is a mechanical load on the transducer.

23. The method as claimed in claim 1 wherein the amplifier and sensory tone generator includes a sensory tone generator, an amplifier and a pre-amplification stage and wherein the sensory tone generator produces a sensory tone, the control signal and the amplifier feedback signal are received by the pre-amplification stage to produce a complete signal, the complete signal and the sensory tone are received by the amplifier to produce the power signal.

24. The method as claimed in claim 23 wherein the amplifier and sensory tone generator further includes a protection circuitry.

25. The method as claimed in claim 24 wherein the pre-amplification stage acts as a power buffer for the control signal and the amplifier feedback signal.

26. The method as claimed in claim 23 wherein the sensory tone is a low voltage signal having an amplitude between 1 mV and 10 V and a frequency between 1 Hz and 1 Mhz.

27. The method as claimed in claim 23 wherein the sensory tone generator includes one of a function generating circuitry, a pseudo-sine wave generating circuitry and a sine wave generating circuitry.

28. The method as claimed in claim 23 wherein the sensory tone signal has an amplitude between 500 mV and 20V.

29. The method as claimed in claim 24 wherein the protection circuitry includes at least one of a series of nonlinear resistors, varistors and zener diodes and a combination thereof.

30. The method as claimed in claim 1 wherein the electroactive polymer transducer and sensory circuitry includes an electroactive polymer transducer, sensory circuitry and protection circuitry whereby the electroactive polymer transducer responds to the power signal and the environmental disturbance and changes the electrical properties thereof and wherein the amplitude of the sensory signal is responsive to the change in electrical properties of the electoractive polymer transducer.

31. The method as claimed in claim 30 wherein the control signal has a frequency spectrum and the sensory signal has a frequency spectrum which is greater than the frequency spectrum of the control signal.

32. The method as claimed in claim 1 wherein the sensory feedback circuitry includes a sensory signals preamplification stage, sensory signals extraction filters, voltage reduction circuitry, control signal preamplification stage, control signal extraction filters and rectification and sampling stage.

33. The method as claimed in claim 32 wherein an amplitude of the total signal is divided in the voltage reduction circuitry by a predetermined amount to produce a reduced total signal.

34. The method as claimed in claim 33 wherein the reduced total signal is buffered and amplified in the control signal preamplification stage and then passed to the control signal extraction filters wherein the recovered and conditioned control signal is extracted therefrom.

35. The method as claimed in claim 34 wherein the sensory signal is buffered and amplified in the sensory signals preamlification stage and then passed to the sensory signals extraction filters wherein the amplified and filtered sensory signal is produced.

36. The method as claimed in claim 35 wherein the rectification and sampling stage receives the amplified and filtered sensory signal and the recovered and conditioned control signal and produces the control system feedback and the amplifier feedback.

* * * * *

UNITED STATES PATENT AND TRADEMARK OFFICE
CERTIFICATE OF CORRECTION

| | | |
|---|---|---|
| PATENT NO. | : 6,969,941 B1 | Page 1 of 1 |
| APPLICATION NO. | : 10/767840 | |
| DATED | : November 29, 2005 | |
| INVENTOR(S) | : Alex Kapps, Landy Toth and Andrew A. Goldenberg | |

It is certified that error appears in the above-identified patent and that said Letters Patent is hereby corrected as shown below:

Column 4, line 41, the formula reading "$C = C_o(\epsilon+1)^2$" should read -- $C = C_o(\varepsilon+1)^2$ --.

Column 4, at line 46 and line 54 replace "$\epsilon$" with the following -- $\varepsilon$ --.

Column 5, line 1, the formula reading "$C = C_o(\epsilon+1)$" should read -- $C = C_o(\varepsilon+1)$ --.

Column 5, line 7, the formula reading "$C = C_o(\epsilon+1)^2$" should read -- $C = C_o(\varepsilon+1)^2$ --.

Column 5, line 24, replace the text "$r_e$" with the following -- $P_e$ --; line 61, the formula reading "$R=R_o (\gamma)$" should read -- $R=R_o (\gamma)^\varepsilon$ --.

Column 6, line 6, reading "electrod" should be replace with -- electrode --.

Column 12, line 18, the text reading "$R_o$" should read -- $R_s$ --; line 22, delete the text "{PARQO}"

Column 12, line 28, the formula reading "$Cs>>C(\epsilon)$" should read -- $Cs>>C(\varepsilon)$ --; line 29, the formula reading "$Rs\approx(\epsilon)$" should read -- $Rs\approx(\varepsilon)$ --.

Column 12, line 38, the formula section reading "C'" should read as -- $C_s$ --.

Signed and Sealed this

Nineteenth Day of September, 2006

JON W. DUDAS
*Director of the United States Patent and Trademark Office*